United States Patent
Wiesler et al.

(10) Patent No.: US 7,058,627 B2
(45) Date of Patent: Jun. 6, 2006

(54) RETICLE MANAGEMENT SYSTEM

(75) Inventors: Oren Wiesler, Wayland, MA (US); Thomas Mariano, Londonderry, NH (US)

(73) Assignee: Brooks Automation, Inc., Chelmsford, MA (US)

(*) Notice: Subject to any disclaimer, the term of this patent is extended or adjusted under 35 U.S.C. 154(b) by 361 days.

(21) Appl. No.: 09/842,370

(22) Filed: Apr. 25, 2001

(65) Prior Publication Data

US 2001/0047222 A1 Nov. 29, 2001

Related U.S. Application Data

(60) Provisional application No. 60/199,453, filed on Apr. 25, 2000.

(51) Int. Cl.
*G06F 17/00* (2006.01)
(52) U.S. Cl. .............................. 707/5; 707/102; 707/10
(58) Field of Classification Search .................... 707/1, 707/5, 104.1, 100; 700/90
See application file for complete search history.

(56) References Cited

U.S. PATENT DOCUMENTS

| | | | | |
|---|---|---|---|---|
| 5,761,064 A | * | 6/1998 | La et al. ...................... | 700/110 |
| 6,078,188 A | | 6/2000 | Bannai et al. ............... | 324/765 |
| 6,099,598 A | | 8/2000 | Yokoyama et al. ......... | 29/25.01 |
| 6,108,585 A | * | 8/2000 | Ryan et al. .................. | 700/112 |
| 6,148,307 A | * | 11/2000 | Burdick et al. ............ | 707/104.1 |
| 6,188,935 B1 | | 2/2001 | Soraoka et al. ............. | 700/229 |
| 6,240,331 B1 | * | 5/2001 | Yun ............................ | 700/121 |
| 6,356,804 B1 | * | 3/2002 | Conboy et al. .............. | 700/228 |
| 6,370,440 B1 | * | 4/2002 | Nakagawa et al. ........... | 700/97 |
| 6,457,587 B1 | * | 10/2002 | Conboy et al. .............. | 209/630 |
| 6,466,945 B1 | * | 10/2002 | Goh et al. ................... | 707/102 |
| 6,606,582 B1 | * | 8/2003 | Brinkman et al. ........... | 702/188 |

FOREIGN PATENT DOCUMENTS

FR    EP 1150187 A2 *  4/2000

OTHER PUBLICATIONS

Lambson, Chuck; Choudhury, Marcel; Davis, Robert; "Automated reticle transport and stepper loading", Solid State Technolog, V. 39, N. 10, p. 97, Oct. 1996, ISSN: 0038-111X.*

(Continued)

*Primary Examiner*—Jean M. Corrielus
(74) *Attorney, Agent, or Firm*—Weingarten, Schurgin, Gagnebin & Lebovici LLP

(57) ABSTRACT

A reticle management system is disclosed that provides data storage and retrieval of data associated with each reticle, reticle carrier, and certain system attributes and also for the efficient movement and storage of reticles and reticle carriers. The reticle management system includes a reticle management controller, a central reticle database, and one or more reticle stockers that include a stocker controller, a stocker database, and a stocker unit. The reticle management controller is coupled to the central reticle database and each of the stocker controllers. Each stocker controller collects data on the reticles, reticle carriers, or both, that are stored within the associated stocker unit and stores this data in the stocker database. The reticle management controller retrieves the data in each stocker database via the associated stocker controller and stores this data in central reticle database. In addition, data attributes for the system, and the reticle carriers within the system may also be stored in the central reticle database.

23 Claims, 10 Drawing Sheets

OTHER PUBLICATIONS

"PRI Automation Automation Announces New Combination Reticle Stocker", PR Newswire, p. 9143, Oct. 26, 1999.*

Assessment of the performance of a reticle stocker with integrated database and the productivity gain obtained in a submicron ASIC watertab, http://www.sea.rl.ac.uk/OldSEA/oldpubs/Retimatic/☐☐.*

Denise Dillon Harris, Automated Reticle Management Increases Efficiency, Throughput, and Capital Investment Utilization, http://www.semiconductorfabtech.com/features/lithography/articles/body3.195.php3.*

Anne M. Murray, "Automated reticle handling: A comparison of distributed and centralized reticle storage and transport", ACM, pp. 1360-1365.*

* cited by examiner 306 (cont.)

| Cleaned By | Character string (255-char. max.) | Identity of Reticle cleaner. |
|---|---|---|
| Location Cleaned | Character string (255-char. max.) | Identity of location where Reticle was last cleaned. |
| Times Inspected | 32-bit unsigned Long | Number of times this Reticle has been inspected. |
| Date Last Inspected | Date/time | Date and time this Reticle was last stored after being inspected. |
| Last Inspected User ID | Character string (255-char. max.) | User name of the operator who last stored the Reticle after being inspected. |
| Inspected By | Character string (255-char. max.) | Identity of Reticle inspector. |
| Location Inspected | Character string (255-char. max.) | Identity of location where Reticle was last inspected. |
| Last Kit Time | Date/time | Date and time when this Reticle was kitted. |
| As Reticle carrier Time | Delta time | Cumulative time this Reticle has spent in a Reticle carrier. This is independent of the Reticle carrier. Only updated upon an un-kitting transformation. |
| Last Un-Kit Time | Date/time | Date and time when this Reticle was un-kitted |
| As Bare Time | Delta time | Cumulative time this Reticle has spent in a bare Reticle Stocker. This is independent of the Stocker. Only updated upon a kit transformation. |
| Date Entered | Date/time | Date and time this Reticle was first entered into the system. |
| Creator User ID | Character string (255-char. max.) | User name of the person who created the Reticle. Assigned when Reticle created. |
| Keep Kitted | Boolean | True/False indication of whether the Rectile is to stay in the Reticle carrier independent of automatic aging. |
| Current Location | Character string (255-char. max.) | Current location of Reticle. |
| Last Location | Character string (255-char. max.) | Previous location of Reticle. |

| Last Reticle Repair | Date/time | Date and time the Reticle was last repaired. | 316 |
| --- | --- | --- | --- |
| Repair Count | 32-bit unsigned Long | Number of times the Reticle has been repaired. | |
| Last Re-pelliclization | Date/time | Date and time the Reticle was last re-pelliclized. | 318 |
| Re-pelliclization Count | 32-bit unsigned Long | Number of time the Reticle has been re-pelliclized. | |
| Hold Time | Date/time | Date and time the Reticle was put on hold. This is blank when not on hold. | 320 |
| Hold User ID | Character string (255-char. max.) | User name of the person who issued the hold. | |

| Attribute Name | Attribute Type | Attribute Definition |
|---|---|---|
| Transport Name | Character string (255-char. max.) | Primary Key.Customer designation given to each Stocker or Aerotrak. Must be unique. |
| Transport Type | Enum (Reticle, Reticle carrier, Aerotrak) | Definition of what type of transport. |
| Transport Capacity | 32-bit unsigned long | Number of locations within the Stocker. Not valid for Aerotrak. |
| Transport Capacity High Water Count | 32-bit unsigned long | Number of shelves allowed to keep full within a transport. Not valid for Aerotrak. |
| Empty Reticle carrier Count | 32-bit unsigned long | Number of empty Reticle carriers contained with in this Stocker. Only valid for Reticle carrier Stockers. |
| Empty Reticle carrier High Water Count | 32-bit unsigned Long | Value set to determine highest number of empties allowed in system. Used in aging and empty management. Only valid for Reticle carrier Stockers. |
| Empty Reticle carrier Low Water Count | 32-bit unsigned Long | Value set to determine lowest number of empties allowed in system. Used in aging and empty management. Only valid for Reticle carrier Stockers. |
| Port Name List | Character string (255-char. max.) | Semicolon delimited list of the port names reachable by this Stocker. |
| Port Type List | Enum List (Reticle, Reticle carrier, Aerotrak) | List of enumerated type indicating the type of port specified in the name list. |
| Age Interval | Delta time | Amount of time this transport uses to determine Reticle carrier usage aging. |
| Age Tier Level | 32-bit unsigned Long | Used to determine tiering of system. Gives an indication of ranking of this transport in relation to others. |

| Attribute Name | Attribute Type | Attribute Definition |
|---|---|---|
| Inspection Max | 32-bit unsigned Long. | Maximum number of times a Reticle is allowed to be inspected. |
| Inspection Bare Interval | Delta time | Amount of time a Reticle is allowed to be bare between inspections. |
| Inspection Reticle carrier Interval | Delta time | Amount of time a Reticle is allowed to be kitted between inspections. |
| Uses between Inspections | 32-bit unsigned Long | Number of uses allowed between inspections. |
| Clean Max | 32-bit unsigned Long | Maximum number of times a Reticle is allowed to be cleaned. |
| Clean Bare Interval | Delta time | Amount of time a Reticle is allowed to be bare between cleanings. |
| Clean Reticle carrier Interval | Delta time | Amount of time a Reticle is allowed to be kitted between cleanings. |
| Uses between Cleanings. | 32-bit unsigned Long | Number of uses allowed between cleanings. |
| Reticle carrier Aging check Interval | Delta time | Time between checks are made to determine Reticle carrier age and possible tier degradation. |

*FIG. 3E*

RETICLE MANAGEMENT SYSTEM

CROSS REFERENCE TO RELATED APPLICATIONS

This application claims priority of Provisional Application No. 60/199,453 filed Apr. 25, 2000 entitled RETICLE MANAGEMENT SYSTEM and incorporated herein by reference.

STATEMENT REGARDING FEDERALLY SPONSORED RESEARCH OR DEVELOPMENT

N/A

BACKGROUND OF THE INVENTION

Lithography represents over 35% of the cost of manufacturing integrated circuits. Because this is a significant portion of the cost of an integrated circuit, reducing the costs associated with lithography and increasing the efficiency of the lithography process are important to lowering the overall costs associated with the manufacture of integrated circuits.

Presently, reticles that are used as masks in the lithography process are manually handled during storage and transport and data related to each reticle is stored on an ad-hoc basis. This leads to inefficient reticle utilization due to missing or lost reticles, over or under inspection of reticles, and over or under cleaning of reticles, or a combination of these or other problems such as reticles being in the wrong locations when needed for processing.

It would therefore be advantageous to have a reticle management system that allows a user to assess current data corresponding to various reticles and to manage the various reticles accordingly.

BRIEF SUMMARY OF THE INVENTION

A reticle management system is disclosed that provides data storage and retrieval of data associated with each reticle, reticle carrier, and certain system attributes and also for the efficient movement and storage of reticles and reticle carriers. The reticle management system includes a reticle management controller, a central reticle database, and one or more reticle stockers that include a stocker controller, a stocker database, and a stocker unit. The reticle management controller is coupled to the central reticle database and each of the stocker controllers. Each stocker controller collects data on the reticles, reticle carriers, or both, that are stored within the associated stocker unit and stores this data in the stocker database. The reticle management controller retrieves the data in each stocker database via the associated stocker controller and stores this data in central reticle database. In addition, data attributes for the system, and the reticle carriers within the system may also be stored in the central reticle database.

The reticle management system may be coupled to a reticle movement system and can allow both user input move commands and automatic move command generation. A user may store reticles, retrieve reticles, move reticles, or provide an alternative use of the reticles such as inspection, cleaning, repair, re-pelliclization, or place a use hold on a reticle.

BRIEF DESCRIPTION OF THE SEVERAL VIEWS OF THE DRAWING

The invention will be more fully understood by reference to the following Detailed Description of the Invention in conjunction with the drawings of which:

FIGS. 3A–3E is a table depicting various attributes of the reticles, reticle carriers, and the system stored in the central database in FIG. 2;

DETAILED DESCRIPTION OF THE INVENTION

As used herein, a reticle is a photo mask or negative used in lithographic processing of semiconductor wafers. A reticle carrier is a material transport vehicle or device that is designed to transport reticles. Kitted refers to a reticle loaded onto a reticle carrier.

Figure 1:
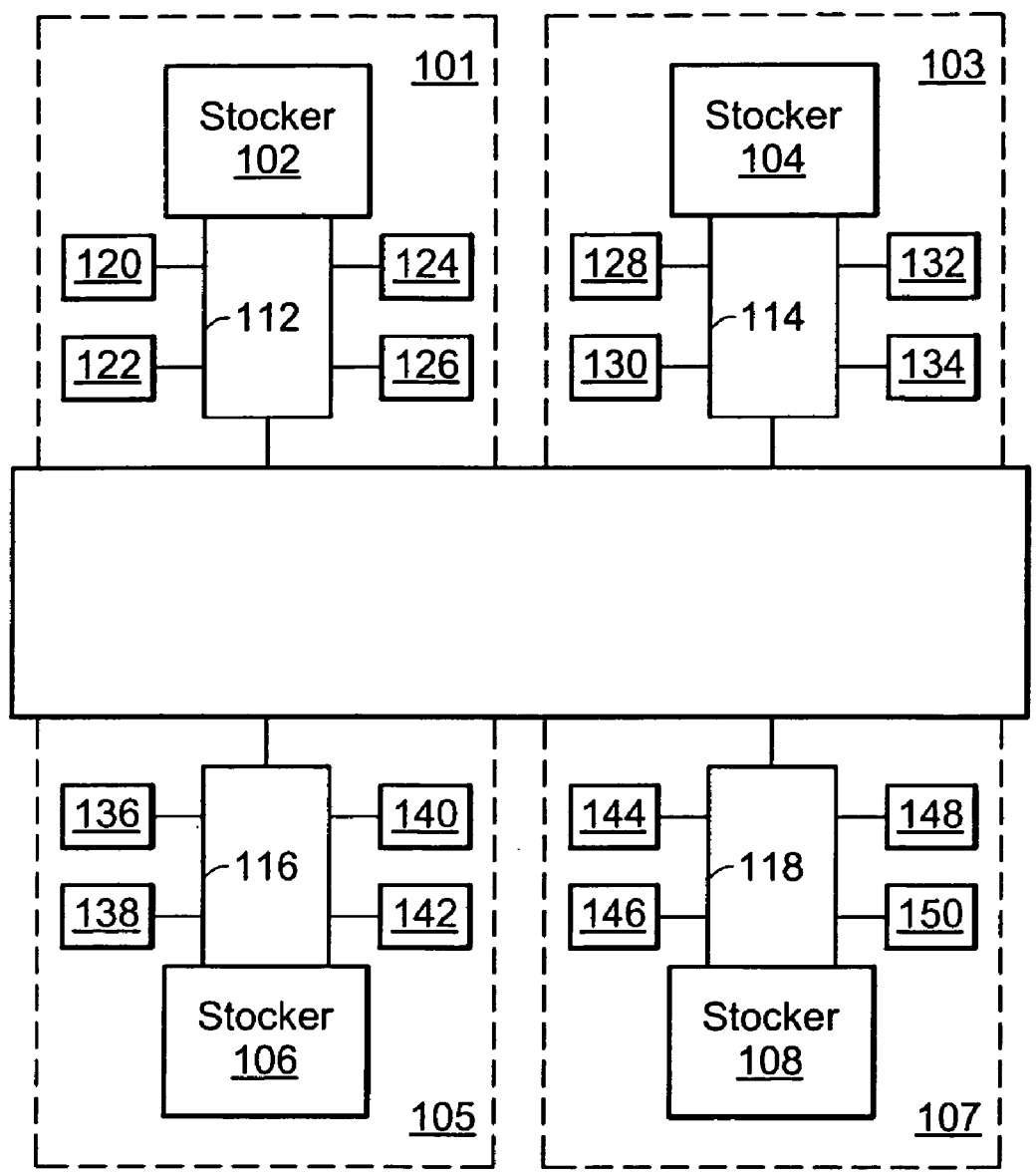
FIG. 1 is a schematic representation of a semiconductor wafer processing facility.

FIG. 1 depicts an exemplary schematic view of a semiconductor manufacturing facility 100. The facility 100 includes a plurality of bays 101, 103, 105, and 107, which typically are clean rooms that may contain various process stations, stockers, and material handling systems. Typically each of the plurality of bays 101–107 has at least one stocker 102, 104, 106, and 108, respectively, that contains lithographic reticles, semiconductor wafers, or both. In addition, each of the plurality of bays 101, 103, 105, and 107 also have one or more processing stations 120–126, 128–134, 136–142, and 144–150, respectively, that are used to process the wafers in the semiconductor manufacturing process. It should be understood that the schematic representation depicted in FIG. 1 is for illustrative purposes only and should only be considered an exemplary system.

Each of the plurality of bays are linked together by an interbay material transport system 110 that allows the automatic transport of wafers, reticles, and other materials between each of the plurality of bays. Each bay 101–107 typically includes an intrabay material transport system 112, 114, 116, and 118, respectively, that is used to transport wafers and reticles from the stockers to the various processing stations within the particular bay. In general the intrabay transport systems 112, 114, 116, and 118 are connected by one or more connections to the interbay transport system 110.

Figure 2:
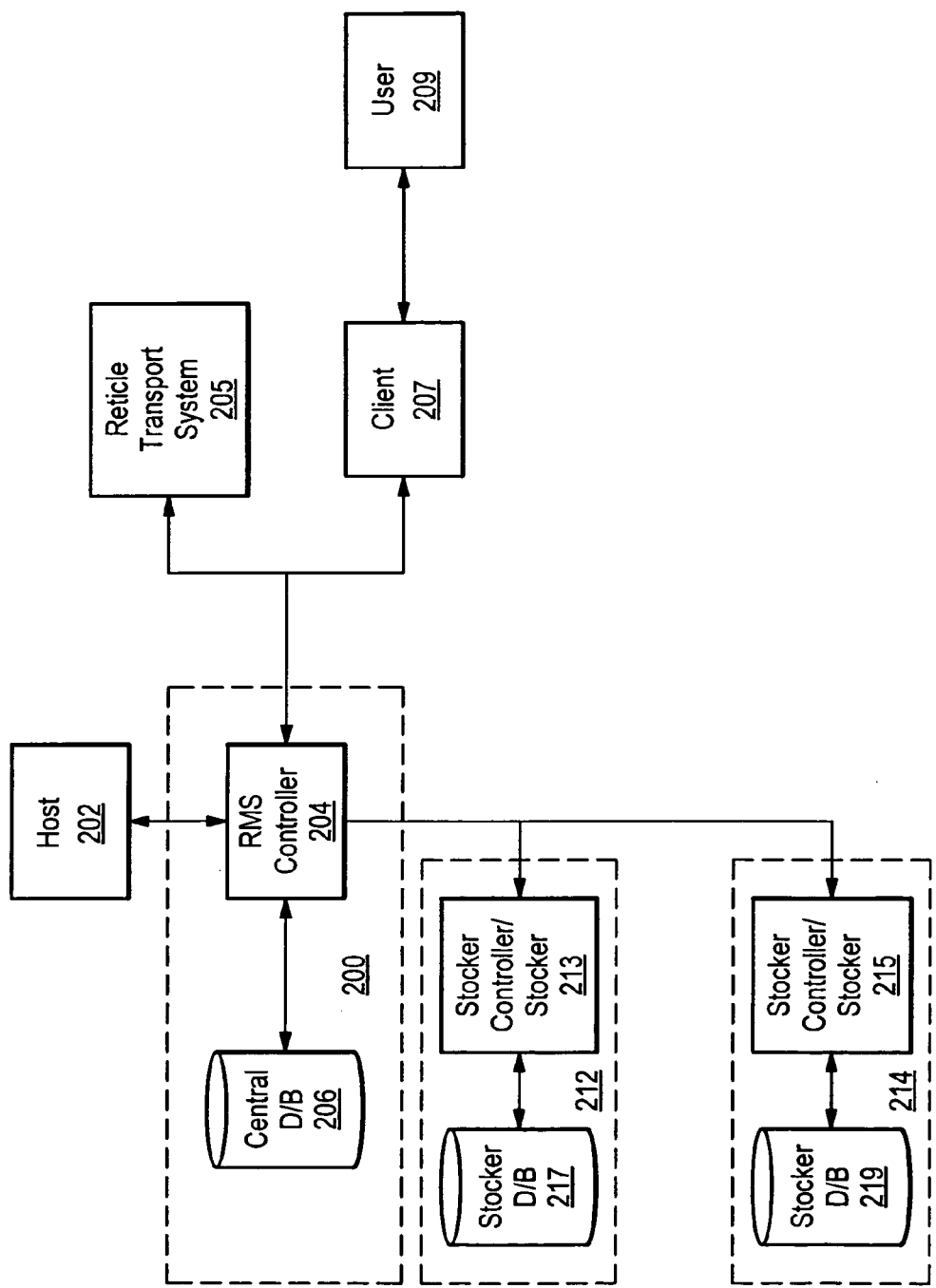
FIG. 2 is a block diagram of a reticle management system in accordance with the present invention.

FIG. 2 depicts a system that is used to control the intrabay and interbay material transport systems to ensure that material is appropriately located and any material movements are performed efficiently. In particular the system depicted in FIG. 2 is used to ensure that the reticles used within the system are stored, retrieved, moved, and maintained in an efficient manner. A host 202 issues commands to the reticle management system (RMS) 200, which is comprised of a RMS controller 204 and a central database 206. The RMS controller 204 communicates with the reticle transport system (RTS) 205. The RMS controller 204 also issues reticle move requests to the RTS 205.

Each stocker 212 and 214 in the system includes a stocker controller and stocker unit, 213 and 215 respectively. The stocker unit includes the hardware controller, the actual stocker hardware itself, and the plurality of storage locations or shelves. A stocker may come in two varieties a bare reticle stocker that is able to store reticles that are not in carriers ("unkitted reticles"), and a reticle carrier stocker that is capable of storing carriers that have reticles within them ("kitted reticles"). A suitable bare reticle robotic stocker is available from PRI Automation, Billerica Mass. A suitable computer that is used as a stocker controller is a Pentium class microprocessor, having a minimum of 64 KB ram, and a minimum of a 1.2 Gbyte hard drive.

Figure 3A:
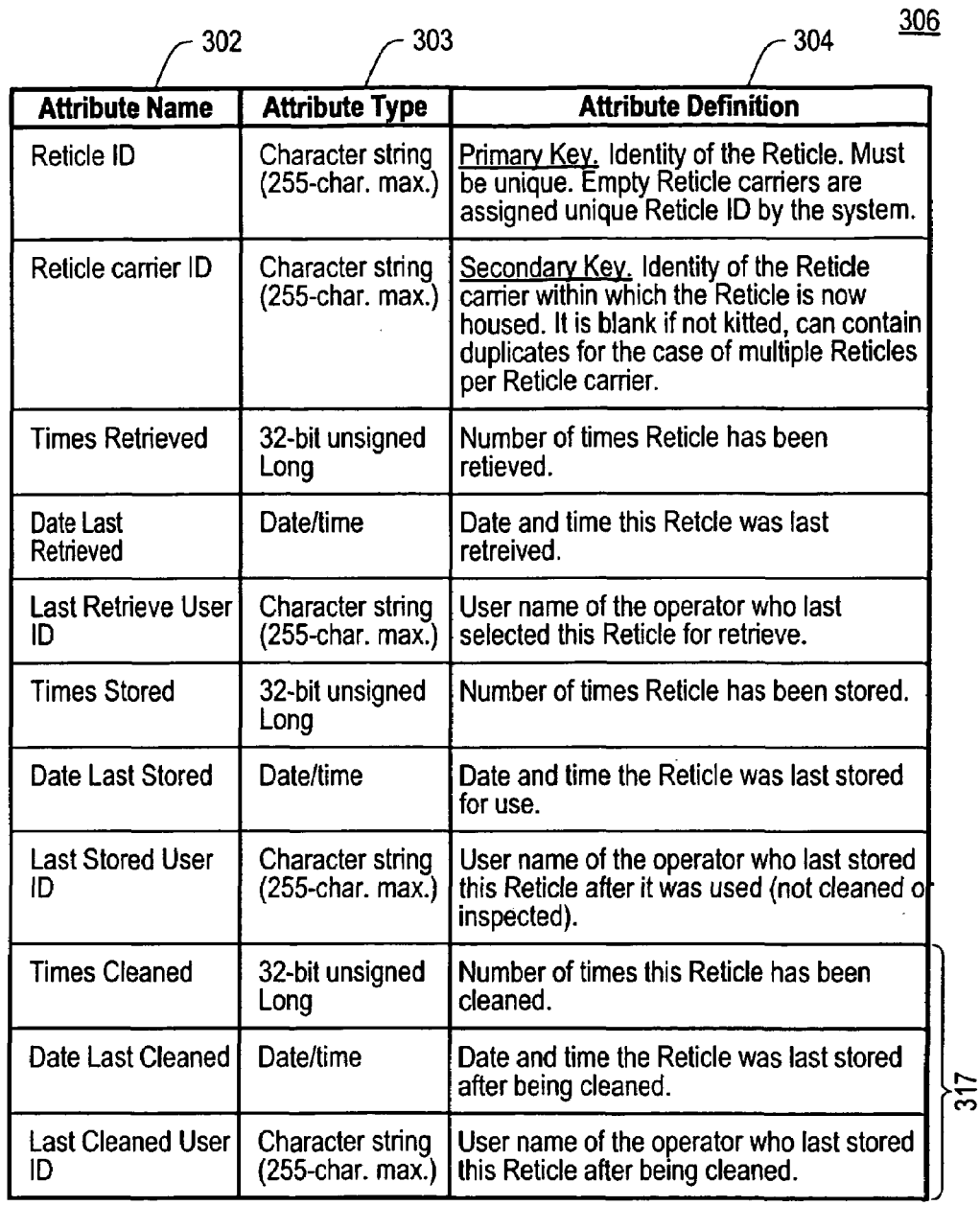

Each stocker 212 and 214 also maintains a database 217 and 219 of the data attributes associated with the particular reticles, carriers, or both that are stored in that particular stocker. The RMS controller 204 interrogates each stocker controller for the data associated with each reticle or carrier stored within the corresponding stocker. The RMS controller 204 stores these data attributes associated with each reticle and reticle carrier in the system in a central database 206. The central database 206 stores not only the data associated with a corresponding reticle and reticle carrier, but also stores system wide data constants as well. FIG. 3 depicts three sets of attributes in which column 302 includes the attributes identifier, column 303 includes an attribute type, and column 304 includes the attribute definition. The first set of attributes 306 include those attributes associated with each reticle stored in the system. The second set of attributes 308 include those attributes associated with each reticle carrier, and the third set of attributes 310 include those attributes associated with the system wide data constants.

As discussed above, the RMS central database 206 stores a plurality of attributes associated with each of the reticles and reticle carriers within the RMS system. In addition to operational data associated with a particular reticle, other data must be maintained as well. During the lifetime of a reticle, each reticle is periodically inspected. Data 312 includes the data associated with the inspections of each reticle. Similarly, each reticle is periodically cleaned. Data 314 tracks the data associated with the cleaning data associated with a particular reticle. In some circumstances, a reticle may need to be repaired after being inspected, data 316 tracks the data associated with reticle repair. Reticles may be re-pelliclized as well. Data 318 tracks the re-pelliclization data for each reticle. During the lifetime of a reticle, a reticle may be placed on hold. During this time no retrieve operations may be performed on this reticle. Data 320 tracks data associated with hold operations associated with any reticle.

The reticle controller can provide this data to a user 209 via a client machine 207 coupled to the RMS controller 204. The user determines the appropriate actions regarding the use of the reticles based on the stored data. Alternatively, the controller can use this data to make autonomous decisions regarding the use of the reticles. As will be explained below, various operations are allowed in terms of manipulating the reticles, and other operations are allowed in terms of maintaining the reticles.

In one embodiment, the RMS controller can include various security levels, such as a system administrator level, which is the highest security level, level 1; a supervisor level, which is a mid security level, level 2; and an operator level, which is the lowest security level, level 3. Level 1 security access should only be granted to qualified personnel and allows those selected personnel to perform system level diagnostics and debugging. Level 2 security is limited to system maintenance personnel. Level 2 security allows a user to recover from a device or hard error, administer operators, and alter some information. Level 3 security is provided to operators and allows them to perform normal operational system functions including recovering from low-level non-destructive system errors. The basic operations that may be performed on a reticle can be grouped according to function and personnel grouped accordingly. The functions can include process oriented actions, inspection oriented actions, cleaning oriented actions, repair oriented actions, re-pellicle oriented actions, and the withdraw from service of the reticle either by holding the reticle from operations or by discontinuing the reticle from any service operation.

The RMS system will allow operators with the means to store, retrieve, move, scan, and to process reticles as needed. The user store command encompasses several options. Upon placement of the payload, which may be bare reticles or a kitted reticle carrier at an operator I/O of a stocker, the RMS system will automatically store the reticle on a local shelf within the stocker. Prior to placing the payload, the user may select additional storage options. For example, a user may direct the RMS to map the reticle carrier, i.e., determine what reticles are contained within the reticle carrier and return to the user, or store the reticle carrier to a local shelf. The user may wish to empty the reticle carrier and store both the reticle and the carrier, or store the reticle and return the reticle carrier to the user. If the current location is a reticle stocker, i.e., a stocker that stores both reticle carriers and reticles, and the destination stocker is a bare reticle stocker, i.e., a stocker that stores only reticles, the RMS will coordinate the commands necessary to move the reticle payload from the source location to the destination location and unload the reticle carrier. If an empty reticle carrier results then, as will be explained in more detail below, an empty reticle carrier management criteria is applied. As will be explained in more detail below, if the reticle was retrieved for any purpose other than process usage, upon storage an entry will be entered in the validation queue. Reticles that are entered in the validation queue require some level of servicing by a qualified persons prior to being retrieved again for any other purpose than the required servicing.

The user retrieve command allows a user to identify a desired reticle. The user selects the desired reticle and a retrieve command is issued. The desired reticle will be retrieved from a shelf in a stocker and placed in the first available output port closest to the physical location of the user. As mentioned above, when a reticle is retrieved the user must declare the intended usage of the reticle. For example in addition to use in processing, a reticle may be retrieved for inspection, cleaning, re-pelliclization, repair, and to be discontinued from service, or a combination of these uses.

A user move command may be selected instead of retrieve in order to move the reticle to another stocker. The RMS provides the user with a listing of available stockers the reticle or reticle carrier may be moved to. The RMS will issue the necessary commands to move the reticle when the user has selected the destination stocker. If the stocker selected is the stocker currently storing the reticle or carrier, the RMS will query the user as to the exact location to move the reticle or carrier to. If the stocker selected is not the current one, then the RMS will generate the commands to move the reticle or carrier to the new destination.

Each stocker has the capability to scan the storage locations contained therein and verify the contents stored thereon. Reticle carrier stockers typically only have the ability to validate a carrier stored in a storage location, but are not able to verify the contents of the reticle carrier. A bare reticle stocker have the capability to validate a reticle stored in a storage location, but also to validate the identity of the reticle as well. In one embodiment, if a reticle carrier is scanned for identity on a system that includes an automated material handling system, the RMS will send the reticle carrier to a bare reticle stocker, complete a scan of the contents of the carrier, and return the carrier to the original stocker upon completion. Thus, a user may direct a stocker to scan the storage locations to validate and identify the material stored therein.

During system startup, all stockers are directed by the RMS controller to scan their storage locations and take an inventory of all reticles and carriers stored therein. It is assumed that the all reticles are out of the system at startup and it is the local information provided by the stocker to the RMS server that is used to populate the RMS database. As new reticles or carriers are added to the system, the stocker containing the new reticle or carrier will provide the necessary data to the RMS controller for storage in the RMS database.

The user may also cancel any user initiated command prior to the beginning of execution of that command.

Figure 4:
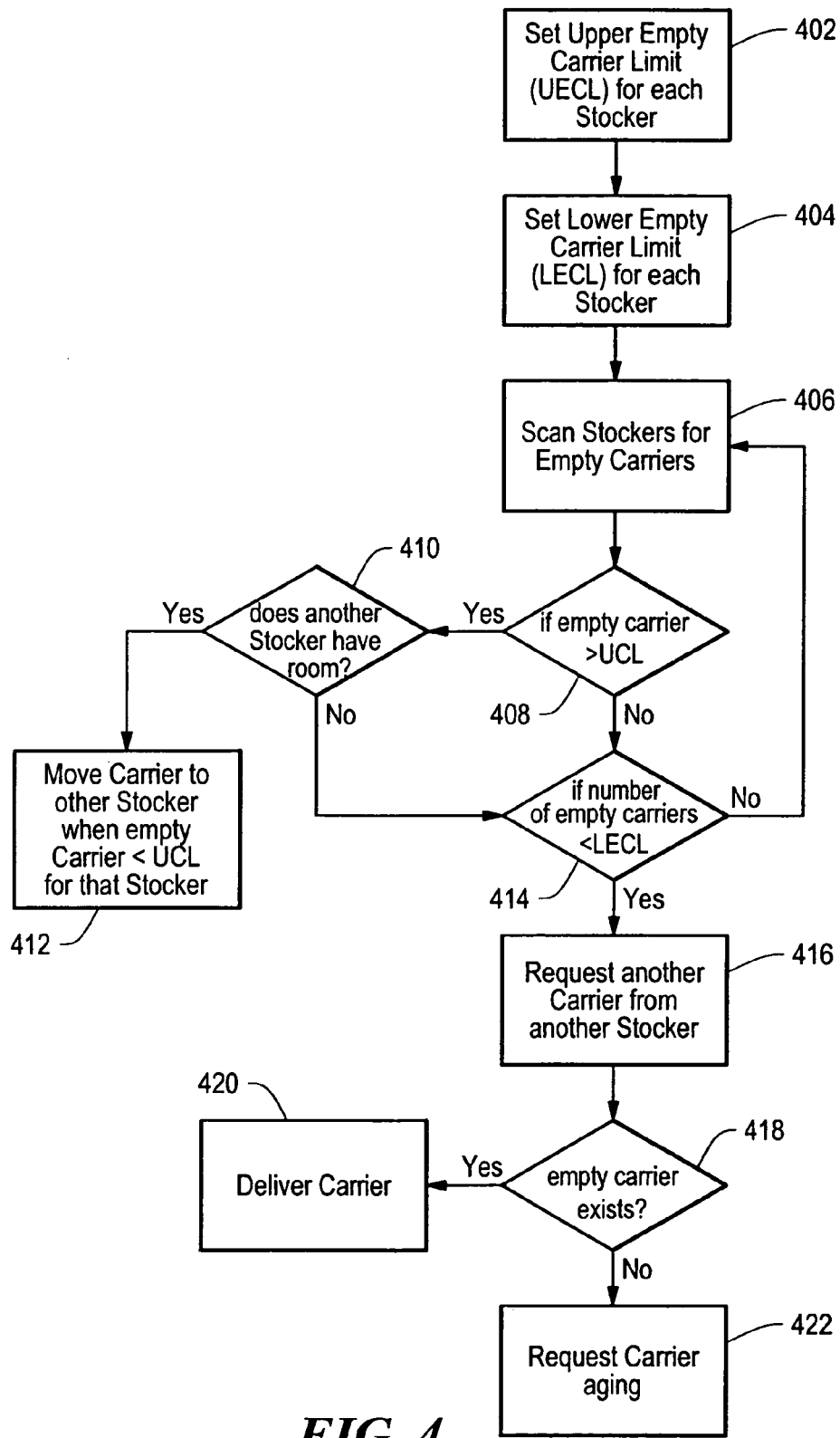
FIG. 4 is a flow chart of a method of empty reticle carrier management in accordance with the present invention.

It is a main function of the RMS to maintain an inventory of empty reticle carriers that are available for kitting operations. The RMS maintains a count of the number of empty reticle carriers at each stocker within the system. Two limits are provided for each stocker and the supply of empty reticle carriers contained there. The first limit is the upper empty carrier limit. The second limit is the lower empty carrier limit. The sum of the upper empty carrier limit for each stocker provides the maximum number of empty carriers that should be kept in the system at any given time. The sum of the lower empty carrier limit for each stocker provides the minimum number of empty carriers that should be kept in the system at any given time. Thus, the minimum number of free reticle carriers serves to prevent the system from being emptied of empty reticle carriers at any given time. FIG. 4 illustrates a method of managing the number of empty reticle carriers within the system. The value of the upper empty carrier limit is determined for each stocker, step 402. The value of the lower empty carrier limit is determined for each stocker, step 504. Each stocker is scanned for empty carriers, step 406, and if the number of free reticle carriers is greater than the upper empty carrier limit for that stocker the RMS controller 204 will search for an available stocker having a number of empty carriers less than the value of the upper empty carrier limit, step 410. If an available stocker exists, then one or more empty reticle carriers are moved to the available stocker, step 412. If no available stocker exists, the empty carrier remains in the stocker. This can only happen if all the stockers have reached the value of the maximum number of free reticle carriers. If the number of reticle carriers is less than the lower empty carrier limit, the RMS controller 204 will request an empty carrier from another stocker, step 416. If no empty reticle carriers exist, the stocker will request carrier aging, step 422. This can only happen if all the stockers have reached the value of the minimum number of free reticle carriers. The next stocker is then checked, step 524. If an empty carrier exists the RMS controller 204 requests that an empty reticle carrier be delivered to the stocker, step 420.

Figure 6:
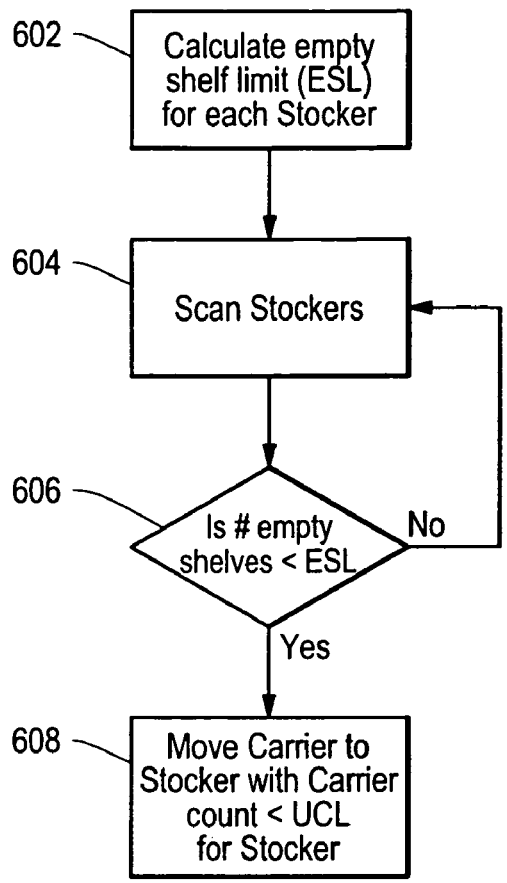
FIG. 6 is a flow chart of a method of empty shelf management in accordance with the present invention.

It is also a function of the RMS to maintain sufficient empty storage locations for each stocker. A number of empty shelves is reserved for each stocker in order to provide sufficient storage. FIG. 6 depicts a method for managing the number of empty shelves within a stocker. The empty shelf limit for each stocker is determined, step 602, by taking the difference between the capacity of the stocker and the value of the upper empty carrier limit for that stocker. The stockers are scanned, step 604, and if a stocker has a number of empty shelves that is less than or equal to the empty shelf limit, a carrier is moved to a stocker with an empty shelf limit that is greater than the empty shelf limit, step 608. If no stockers are available, the RMS controller 204 is notified and carrier aging requested.

In order to provide available empty reticle carriers a method is provided to determine when a carrier reticle can be reused in a process referred to as carrier ageing. Carrier aging allows frequently used reticles to be kept kitted, i.e., stored in reticle carriers and less frequently used reticles kept un-kitted, i.e., not stored in a reticle carrier. Carrier aging requests occur under three conditions. The first condition is when a request for an empty reticle carrier is made that can not be filled. A second condition is the RMS controller 204 increasing the age of reticle carriers periodically during the time they are idle. This period of time when the RMS controller 204 ages carriers is a system wide constant. The third condition is when the lower empty carrier limit of the RMS system has been reached.

When a certain age limit is reached by one or more reticle carriers within a given time period, one or more of the aged reticle carriers will undergo tier level reduction. Tier level reduction can occur in two ways. In the first way, the reticle carrier is un-kitted and any reticles stored therein are unloaded and stored in a stocker. The second way is to move the kitted reticle carrier to another stocker.

Figure 5:
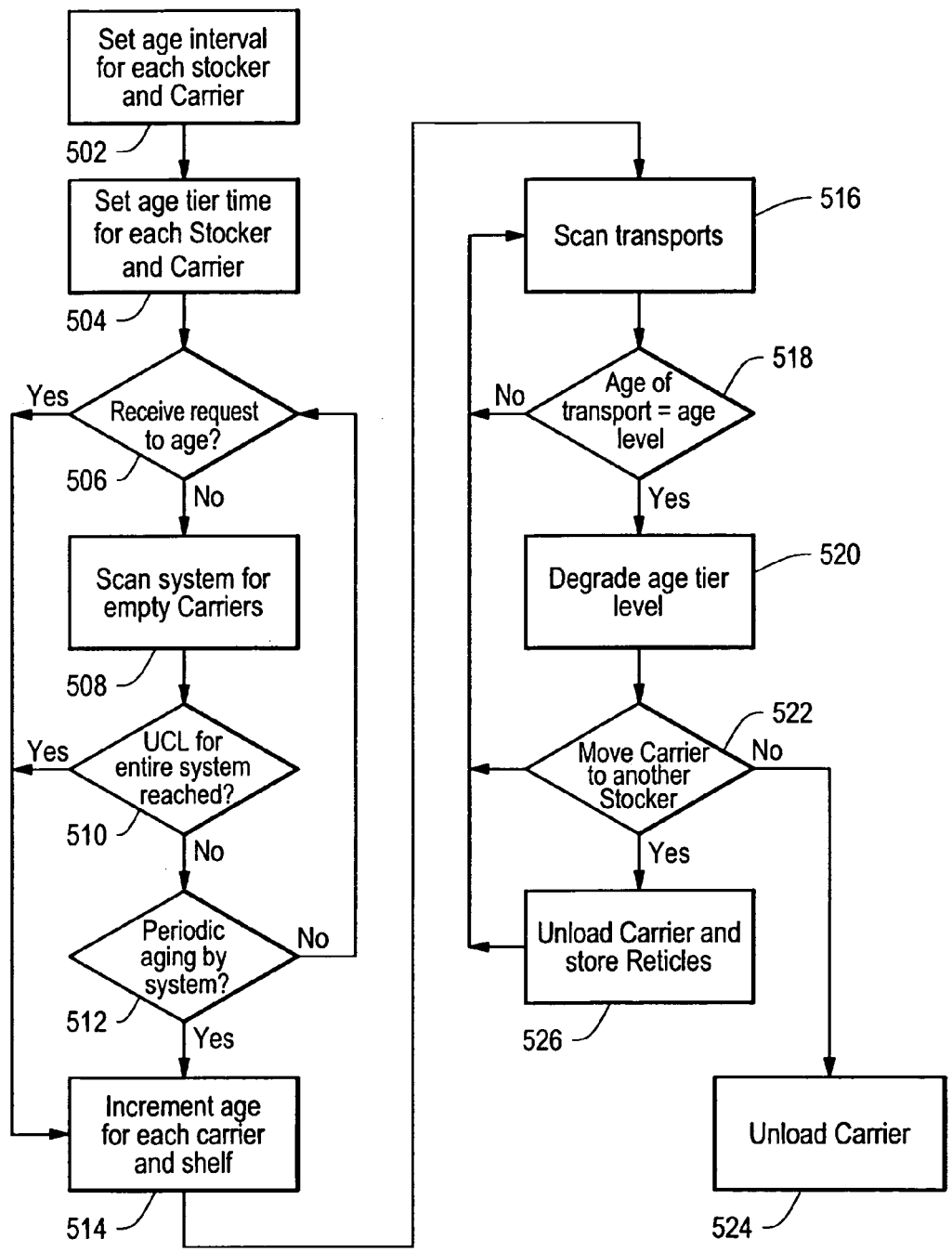
FIG. 5 is a flow chart of a method of carrier aging in accordance with the present invention.

FIG. 5 illustrates reticle carrier aging by the RMS controller 204. Each stocker is assigned an age tier level and an age limit, step 502, and an age tier time, step 504. The RMS controller 204 then monitors for one of the three occurrence to occur to age the idle carriers. If the RMS controller 204 receives a request to age the carriers 506, then control is passed to step 514. If no request to age the carriers is received, the RMS controller 204 scans the RMS system for empty carriers, step 508 and determines if the upper empty carrier limit has been reached, step 510. If the upper empty carrier limit has been reached, control is passed to step 514. If the upper empty carrier limit has not been reached, the RMS controller 204 determines if the system is to be periodically aged according to system wide parameters, step 512. If the system is to be aged, then control passes to step 514.

The RMS controller 204 increments the age of each carrier within the RMS system, step 514. The RMS controller 204 scans the reticle carriers in the RMS system, step 516, and determines if any carriers have an age that is greater than the age level for the current stocker, step 518. If carriers are found that exceed the age level for the current stocker, age tier level degradation is performed, step 520. If the carrier can be moved to another stocker having a age tier level less than the current stocker, step 522, the carrier is then moved, step 524. If there is no other available stocker, the carrier is unloaded and the reticles stored, step 526

Each type of system move request, whether made by a user or the RMS can be prioritized relative to other move commands and other commands in general by the RMS. In one embodiment, priorities from 0 to 9 are used, 9 being the highest priority. In this embodiment, moves caused by reticle carrier aging are assigned a priority of three (3), and moves caused by tier degradation, empty reticle carrier moves and empty shelf moves are given a priority of five (5).

The RMS is also capable of planning and executing moves so as to optimize and improve delivery times to the operators or to specific processing equipment. To accomplish this, the RMS needs to know which reticles are to be used in the near-term and where these reticles are needed to be. This type of information is typically provided by the host 202. The RMS creates a set of data consisting of 4 pieces of data. The move plan data set includes a particular reticle, identified by the reticle ID, to be transported in a specific reticle carrier, to a storage location within a specified stocker, at a particular date and time. Typically move plans can include a plurality of data sets, and a data plan is executed entirety. Also typically, only one move plan can be executed at one time, and subsequent plans are assumed to update or remove the existing plan. During execution of the move plan, the data sets comprising the move plan are ordered according to the desired execution time. Once ordered, the RMS issues commands to move the specified reticles to the specified locations. The RMS ensures that reticles moved as a part of the execution of a move plan will not be bumped out of the desired location as a result of carrier aging or empty carrier management criteria.

Those of ordinary skill in the art should further appreciate that variations to and modification of the above-described methods and apparatus for a folding amplifier may be made without departing from the inventive concepts disclosed herein. Accordingly, the invention should be viewed as limited solely by the scope and spirit of the appended claims.

What is claimed is:

1. An apparatus including at least one processor and at least one memory, the processor being operative to execute at least one program out of the memory for managing data corresponding to a plurality of reticles in a semiconductor manufacturing system, comprising:

a central reticle database configured and arranged to store data associated with the plurality of reticles;

a reticle management controller communicably coupled to the central reticle database, the reticle management controller configured and arranged to store data in the central reticle database, and to retrieve data from the central reticle database; and at least one stocker including a stocker database, a stocker controller communicably coupled to the stocker database and communicably coupled to the reticle management controller, and a plurality of storage locations configured and arranged to store the plurality of reticles, the stocker controller being configured and arranged to store data corresponding to the plurality of reticles stored within the plurality of storage locations within the stocker database, wherein the data associated with the plurality of reticles stored in the central reticle database includes first and second data, each of the first and second data including a plurality of data portions, each portion of the first data being associated with a respective reticle stored in the at least one stocker, and each portion of the second data corresponding to at least one predetermined data constant associated with the plurality of reticles stored in the at least one stocker, wherein the reticle management controller is configured and arranged to retrieve at least a portion of the data corresponding to the plurality of reticles stored within the stocker database, and to store the retrieved data portion within the central reticle database, wherein the reticle management controller is further configured and arranged to manipulate and to maintain the plurality of reticles based on one or more portions of the first data associated with the respective reticles stored in the at least one stocker, and one or more portions of the second data corresponding to the predetermined data constants associated with the plurality of reticles stored in the at least one stocker, wherein the portions of the first data corresponding to each of the plurality of reticles stored in the central reticle database includes a plurality of reticle identifying data, wherein the plurality of reticle identifying data includes an attribute identifying the reticle, and an attribute identifying the location of the reticle, and wherein the plurality of reticle identifying data further includes:

an attribute identifying a reticle carrier housing the reticle;

an attribute identifying a date and time the reticle was entered into use; and an attribute identifying a user identifier who created the reticle.

2. The apparatus of claim 1 wherein the portions of the first data corresponding to each of the plurality of reticles stored in the central reticle database includes a plurality of reticle history data.

3. An apparatus including at least one processor and at least one memory, the processor being operative to execute at least one program out of the memory for managing data corresponding to a plurality of reticles in a semiconductor manufacturing system, comprising:

a central reticle database configured and arranged to store data associated with the plurality of reticles;

a reticle management controller communicably coupled to the central reticle database, the reticle management controller configured and arranged to store data in the central reticle database, and to retrieve data from the central reticle database; and at least one stocker including a stocker database, a stocker controller communicably coupled to the stocker database and communicably coupled to the reticle management controller, and a plurality of storage locations configured and arranged to store the plurality of reticles, the stocker controller being configured and arranged to store data corresponding to the plurality of reticles stored within the plurality of storage locations within the stocker database, wherein the data associated with the plurality of reticles stored in the central reticle database includes first and second data, each of the first and second data including a plurality of data portions, each portion of the first data being associated with a respective reticle stored in the at least one stocker, and each portion of the second data corresponding to at least one predetermined data constant associated with the plurality of reticles stored in the at least one stocker, wherein the reticle management controller is configured and arranged to retrieve at least a portion of the data corresponding to the plurality of reticles stored within the stocker database, and to store the retrieved data portion within the central reticle database, wherein the reticle management controller is further configured and arranged to manipulate and to maintain the plurality of reticles based on one or more portions of the first data associated with the respective reticles stored in the at least one stocker, and one or more portions of the second data corresponding to the predetermined data constants associated with the plurality of reticles stored in the at least one stocker, and wherein the portions of the first data corresponding to each of the plurality of reticles stored in the central reticle database includes a plurality of reticle history data including:
an attribute identifying the number of times the reticle has been retrieved;
an attribute identifying the date the reticle was last retrieved;
an attribute identifying the number of times the reticle has been stored; and
an attribute identifying the date the reticle was last stored.

4. An apparatus including at least one processor and at least one memory, the processor being operative to execute at least one program out of the memory for managing data corresponding to a plurality of reticles in a semiconductor manufacturing system, comprising:
a central reticle database configured and arranged to store data associated with the plurality of reticles;
a reticle management controller communicably coupled to the central reticle database, the reticle management controller configured and arranged to store data in the central reticle database, and to retrieve data from the central reticle database; and
at least one stocker including a stocker database, a stocker controller communicably coupled to the stocker database and communicably coupled to the reticle management controller, and a plurality of storage locations configured and arranged to store the plurality of reticles, the stocker controller being configured and arranged to store data corresponding to the plurality of reticles stored within the plurality of storage locations within the stocker database,
wherein the data associated with the plurality of reticles stored in the central reticle database includes first and second data, each of the first and second data including a plurality of data portions, each portion of the first data being associated with a respective reticle stored in the at least one stocker, and each portion of the second data corresponding to at least one predetermined data constant associated with the plurality of reticles stored in the at least one stocker, wherein the reticle management controller is configured and arranged to retrieve at least a portion of the data corresponding to the plurality of reticles stored within the stocker database, and to store the retrieved data portion within the central reticle database,
wherein the reticle management controller is further configured and arranged to manipulate and to maintain the plurality of reticles based on one or more portions of the first data associated with the respective reticles stored in the at least one stocker, and one or more portions of the second data corresponding to the predetermined data constants associated with the plurality of reticles stored in the at least one stocker, and
wherein the portions of the first data corresponding to each of the plurality of reticles stored in the central reticle database includes a plurality of reticle history data including:
an attribute identifying a user identifier who last selected the reticle; and
an attribute identifying a user identifier who last stored the reticle.

5. The apparatus of claim 4 wherein the portions of the first data corresponding to each of the plurality of reticles stored in the central reticle database includes a plurality of reticle maintenance data.

6. An apparatus including at least one processor and at least one memory, the processor being operative to execute at least one program out of the memory for managing data corresponding to a plurality of reticles in a semiconductor manufacturing system, comprising:
a central reticle database configured and arranged to store data associated with the plurality of reticles;
a reticle management controller communicably coupled to the central reticle database, the reticle management controller configured and arranged to store data in the central reticle database, and to retrieve data from the central reticle database; and
at least one stocker including a stocker database, a stocker controller communicably coupled to the stocker database and communicably coupled to the reticle management controller, and a plurality of storage locations configured and arranged to store the plurality of reticles, the stocker controller being configured and arranged to store data corresponding to the plurality of reticles stored within the plurality of storage locations within the stocker database,
wherein the data associated with the plurality of reticles stored in the central reticle database includes first and second data, each of the first and second data including a plurality of data portions, each portion of the first data being associated with a respective reticle stored in the at least one stocker, and each portion of the second data corresponding to at least one predetermined data constant associated with the plurality of reticles stored in the at least one stocker, wherein the reticle management controller is configured and arranged to retrieve at least a portion of the data corresponding to the plurality of reticles stored within the stocker database, and to store the retrieved data portion within the central reticle database,
wherein the reticle management controller is further configured and arranged to manipulate and to maintain the plurality of reticles based on one or more portions of the first data associated with the respective reticles stored in the at least one stocker, and one or more portions of the second data corresponding to the predetermined data constants associated with the plurality of reticles stored in the at least one stocker,
wherein the portions of the first data corresponding to each of the plurality of reticles stored in the central reticle database includes a plurality of reticle maintenance data, and
wherein the portions of the first data corresponding to each of the plurality of reticles stored in the central reticle database includes the plurality of reticle maintenance data including:
an attribute identifying the number of times the reticle has been cleaned;
an attribute identifying the date on which the reticle was last cleaned;
an attribute identifying the number of times the reticle was inspected; and
an attribute identifying the date on which the reticle was last inspected.

7. The apparatus of claim 6 wherein the plurality of reticle maintenance data further includes:
an attribute identifying a user identifier who last cleaned the reticle;
an attribute identifying a location where the reticle was last cleaned;
an attribute identifying a user identifier who last inspected the reticle; and an attribute identifying a location where the reticle was last inspected.

8. The apparatus of claim 6 further including:
a central system database configured and arranged to store portions of the second data corresponding to system requirements of the plurality of reticles,
wherein the reticle management controller is communicably coupled to the central system database, the reticle management controller being configured and arranged to store and to retrieve the system data from the central system database.

9. An apparatus including at least one processor and at least one memory, the processor being operative to execute at least one program out of the memory for managing data corresponding to a plurality of reticles in a semiconductor manufacturing system, comprising:
a central reticle database configured and arranged to store data associated with the plurality of reticles;
a reticle management controller communicably coupled to the central reticle database, the reticle management controller configured and arranged to store data in the central reticle database, and to retrieve data from the central reticle database; and
at least one stocker including a stocker database, a stocker controller communicably coupled to the stocker database and communicably coupled to the reticle management controller, and a plurality of storage locations configured and arranged to store the plurality of reticles, the stocker controller being configured and arranged to store data corresponding to the plurality of reticles stored within the plurality of storage locations within the stocker database,
wherein the data associated with the plurality of reticles stored in the central reticle database includes first and second data, each of the first and second data including a plurality of data portions, each portion of the first data being associated with a respective reticle stored in the at least one stocker, and each portion of the second data corresponding to at least one predetermined data constant associated with the plurality of reticles stored in the at least one stocker, wherein the reticle management controller is configured and arranged to retrieve at least a portion of the data corresponding to the plurality of reticles stored within the stocker database, and to store the retrieved data portion within the central reticle database,
wherein the reticle management controller is further configured and arranged to manipulate and to maintain the plurality of reticles based on one or more portions of the first data associated with the respective reticles stored in the at least one stocker, and one or more portions of the second data corresponding to the predetermined data constants associated with the plurality of reticles stored in the at least one stocker,
further including:
a central system database configured and arranged to store portions of the second data corresponding to system requirements of the plurality of reticles,
wherein the reticle management controller is communicably coupled to the central system database, the reticle management controller being configured and arranged to store and to retrieve the system data from the central system database, and
wherein the portions of the second data corresponding to the system requirements of the plurality of reticles includes:

an attribute identifying the maximum number of cleanings of a reticle;
an attribute identifying the maximum number of inspections of a reticle;
an attribute identifying the maximum number of uses of a reticle between inspections; and
an attribute identifying the maximum number of uses of a reticle between cleaning.

10. An apparatus including at least one processor and at least one memory, the processor being operative to execute at least one program out of the memory for managing data corresponding to a plurality of reticles in a semiconductor manufacturing system, comprising:
a central reticle database configured and arranged to store data associated with the plurality of reticles;
a reticle management controller communicably coupled to the central reticle database, the reticle management controller configured and arranged to store data in the central reticle database, and to retrieve data from the central reticle database; and
at least one stocker including a stocker database, a stocker controller communicably coupled to the stocker database and communicably coupled to the reticle management controller, and a plurality of storage locations configured and arranged to store the plurality of reticles, the stocker controller being configured and arranged to store data corresponding to the plurality of reticles stored within the plurality of storage locations within the stocker database,
wherein the data associated with the plurality of reticles stored in the central reticle database includes first and second data, each of the first and second data including a plurality of data portions, each portion of the first data being associated with a respective reticle stored in the at least one stocker, and each portion of the second data corresponding to at least one predetermined data constant associated with the plurality of reticles stored in the at least one stocker, wherein the reticle management controller is configured and arranged to retrieve at least a portion of the data corresponding to the plurality of reticles stored within the stocker database, and to store the retrieved data portion within the central reticle database,
wherein the reticle management controller is further configured and arranged to manipulate and to maintain the plurality of reticles based on one or more portions of the first data associated with the respective reticles stored in the at least one stocker, and one or more portions of the second data corresponding to the predetermined data constants associated with the plurality of reticles stored in the at least one stocker,
further including:
a central system database configured and arranged to store portions of the second data corresponding to system requirements of the plurality of reticles,
wherein the reticle management controller is communicably coupled to the central system database, the reticle management controller being configured and arranged to store and to retrieve the system data from the central system database, and
wherein the portions of the second data corresponding to the system requirements of the plurality of reticles includes:
an attribute identifying the maximum time between inspections of a bare reticle; and
an attribute identifying the maximum time between cleanings of a bare reticle.

11. An apparatus including at least one processor and at least one memory, the processor being operative to execute at least one program: out of the memory for managing data corresponding to a plurality of reticles in a semiconductor manufacturing system, comprising:
- a central reticle database configured and arranged to store data associated with the plurality of reticles;
- a reticle management controller communicably coupled to the central reticle database, the reticle management controller configured and arranged to store data in the central reticle database, and to retrieve data from the central reticle database; and
- at least one stocker including a stocker database, a stocker controller communicably coupled to the stocker database and communicably coupled to the reticle management controller, and a plurality of storage locations configured and arranged to store the plurality of reticles, the stocker controller being configured and arranged to store data corresponding to the plurality of reticles stored within the plurality of storage locations within the stocker database,
- wherein the data associated with the plurality of reticles stored in the central reticle database includes first and second data, each of the first and second data including a plurality of data portions, each portion of the first data being associated with a respective reticle stored in the at least one stocker, and each portion of the second data corresponding to at least one predetermined data constant associated with the plurality of reticles stored in the at least one stocker, wherein the reticle management controller is configured and arranged to retrieve at least a portion of the data corresponding to the plurality of reticles stored within the stocker database, and to store the retrieved data portion within the central reticle database,
- wherein the reticle management controller is further configured and arranged to manipulate and to maintain the plurality of reticles based on one or more portions of the first data associated with the respective reticles stored in the at least one stocker, and one or more portions of the second data corresponding to the predetermined data constants associated with the plurality of reticles stored in the at least one stocker,
- further including:
- a central system database configured and arranged to store portions of the second data corresponding to system requirements of the plurality of reticles,
- wherein the reticle management controller is communicably coupled to the central system database, the reticle management controller being configured and arranged to store and to retrieve the system data from the central system database, and
- wherein the portions of the second data corresponding to the system requirements of the plurality of reticles includes:
- an attribute identifying the maximum time between inspections of a kitted reticle; and
- an attribute identifying the maximum time between cleanings of a kitted reticle.

12. The apparatus of claim 11 further including a plurality of stockers, each of the plurality of stockers including a stocker controller communicably coupled to the reticle management controller, a stocker database, and a plurality of storage locations configured and arranged to store at least one of the plurality of reticles, the stocker controller configured and arranged to collect at least a portion of the first and second data, and to store the at least a portion of the first and second data within the stocker database,
wherein the reticle management controller is configured and arranged to receive at least apportion of the first and second data from each of the plurality of stocker controllers, and to provide at least a portion of the first and second data to each of the plurality of stocker controllers.

13. An apparatus including at least one processor and at least one memory, the processor being operative to execute at least one program out of the memory for managing data corresponding to a plurality of reticles in a semiconductor manufacturing system, comprising:
- a central reticle database configured and arranged to store data associated with the plurality of reticles; and
- a reticle management controller communicably coupled to the central reticle database, the reticle management controller configured and arranged to store data in the central reticle database, and to retrieve data from the central reticle database, wherein the data associated with the plurality of reticles includes first and second data, each of the first and second data including a plurality of data portions, each portion of the first data being associated with a respective reticle, and each portion of the second data corresponding to at least one predetermined data constant associated with the plurality of reticles,
- wherein the portions of the first data associated with the respective ones of the plurality of reticles includes a plurality of reticle identifying data,
- wherein the plurality of reticle identifying data includes:
- an attribute identifying the reticle; and
- an attribute identifying the location of the reticle, and
- wherein the plurality of reticle identifying data further includes:
- an attribute identifying a reticle carrier housing the reticle;
- an attribute identifying a date and time the reticle was entered into use; and
- an attribute identifying a user identifier who created the reticle.

14. The apparatus of claim 13 wherein the portions of the first data associated with the respective ones of the plurality of reticles includes a plurality of reticle history data.

15. An apparatus including at least one processor and at least one memory, the processor being operative to execute at least one program out of the memory for managing data corresponding to a plurality of reticles in a semiconductor manufacturing system, comprising:
- a central reticle database configured and arranged to store data associated with the plurality of reticles; and
- a reticle management controller communicably coupled to the central reticle database, the reticle management controller configured and arranged to store data in the central reticle database, and to retrieve data from the central reticle database,
- wherein the data associated with the plurality of reticles includes first and second data, each of the first and second data including a plurality of data portions, each portion of the first data being associated with a respective reticle, and each portion of the second data corresponding to at least one predetermined data constant associated with the plurality of reticles, and
- wherein the portions of the first data associated with the respective ones of the plurality of reticles includes a plurality of reticle history data including:
- an attribute identifying the number of times the reticle has been retrieved;

an attribute identifying the date the reticle was last retrieved;

an attribute identifying the number of times the reticle has been stored; and an attribute identifying the date the reticle was last stored.

16. An apparatus including at least one processor and at least one memory, the processor being operative to execute at least one program out of the memory for managing data corresponding to a plurality of reticles in a semiconductor manufacturing system, comprising:

a central reticle database configured and arranged to store data associated with the plurality of reticles; and a reticle management controller communicably coupled to the central reticle database, the reticle management controller configured and arranged to store data in the central reticle database, and to retrieve data from the central reticle database, wherein the data associated with the plurality of reticles includes first and second data, each of the first and second data including a plurality of data portions, each portion of the first data being associated with a respective reticle, and each portion of the second data corresponding to at least one predetermined data constant associated with the plurality of reticles, and wherein the portions of the first data associated with the respective ones of the plurality of reticles includes a plurality of reticle history data including:

an attribute identifying a user identifier who last selected the reticle; and an attribute identifying a user identifier who last stored the reticle.

17. The apparatus of claim 16 wherein the portions of the first data associated with the respective ones of the plurality of reticles includes a plurality of reticle maintenance data.

18. An apparatus including at least one processor and at least one memory, the processor being operative to execute at least one program out of the memory for managing data corresponding to a plurality of reticles in a semiconductor manufacturing system, comprising:

a central reticle database configured and arranged to store data associated with the plurality of reticles; and a reticle management controller communicably coupled to the central reticle database, the reticle management controller configured and arranged to store data in the central reticle database, and to retrieve data from the central reticle database, wherein the data associated with the plurality of reticles includes first and second data, each of the first and second data including a plurality of data portions, each portion of the first data being associated with a respective reticle, and each portion of the second data corresponding to at least one predetermined data constant associated with the plurality of reticles, wherein the portions of the first data associated with the respective ones of the plurality of reticles includes a plurality of reticle maintenance data, and wherein the plurality of reticle maintenance data includes:

an attribute identifying the number of times the reticle has been cleaned;

an attribute identifying the date on which the reticle was last cleaned;

an attribute identifying the number of times the reticle was inspected; and an attribute identifying the date on which the reticle was last inspected.

19. The apparatus of claim 18 wherein the plurality of reticle maintenance data further includes:

an attribute identifying a user identifier who last cleaned the reticle;

an attribute identifying a location where the reticle was last cleaned;

an attribute identifying a user identifier who last inspected the reticle; and an attribute identifying a location where the reticle was last inspected.

20. The apparatus of claim 18 further including:

a central system database configured and arranged to store portions of the second data corresponding to system requirements of the plurality of reticles, wherein the reticle management controller is communicably coupled to the central system database, the reticle management controller being configured and arranged to store and to retrieve the system data from the central system database.

21. An apparatus including at least one processor and at least one memory, the processor being operative to execute at least one program out of the memory for managing data corresponding to a plurality of reticles in a semiconductor manufacturing system, comprising:

a central reticle database configured and arranged to store data associated with the plurality of reticles; and a reticle management controller communicably coupled to the central reticle database, the reticle management controller configured and arranged to store data in the central reticle database, and to retrieve data from the central reticle database, wherein the data associated with the plurality of reticles includes first and second data, each of the first and second data including a plurality of data portions, each portion of the first data being associated with a respective reticle, and each portion of the second data corresponding to at least one predetermined data constant associated with the plurality of reticles, further including:

a central system database configured and arranged to store portions of the second data corresponding to system requirements of the plurality of reticles, wherein the reticle management controller is communicably coupled to the central system database, the reticle management controller being configured and arranged to store and to retrieve the system data from the central system database, and wherein the portions of the second data corresponding to the system requirements of the plurality of reticles includes:

an attribute identifying the maximum number of cleanings of a reticle;

an attribute identifying the maximum number of inspections of a reticle;

an attribute identifying the maximum number of uses of a reticle between inspections; and an attribute identifying the maximum number of uses of a reticle between cleaning.

22. An apparatus including at least one processor and at least one memory, the processor being operative to execute at least one program out of the memory for managing data corresponding to a plurality of reticles in a semiconductor manufacturing system, comprising:

a central reticle database configured and arranged to store data associated with the plurality of reticles; and a reticle management controller communicably coupled to the central reticle database, the reticle management controller configured and arranged to store data in the central reticle database, and to retrieve data from the central reticle database, wherein the data associated with the plurality of reticles includes first and second data, each of the first and second data including a plurality of data portions, each portion of the first data being associated with a respective reticle, and each portion of the second data corresponding to at least one predetermined data constant associated with the plurality of reticles, further including:

a central system database configured and arranged to store portions of the second data corresponding to system requirements of the plurality of reticles, wherein the reticle management controller is communicably coupled to the central system database, the reticle management controller being configured and arranged to store and to retrieve the system data from the central system database, and wherein the portions of the second data corresponding to the system requirements of the plurality of reticles includes:

an attribute identifying the maximum time between inspections of a bare reticle; and an attribute identifying the maximum time between cleanings of a bare reticle.

23. An apparatus including at least one processor and at least one memory, the processor being operative to execute at least one program out of the memory for managing data corresponding to a plurality of reticles in a semiconductor manufacturing system, comprising:

a central reticle database configured and arranged to store data associated with the plurality of reticles; and a reticle management controller communicably coupled to the central reticle database, the reticle management controller configured and arranged to store data in the central reticle database, and to retrieve data from the central reticle database, wherein the data associated with the plurality of reticles includes first and second data, Each of the first and second data including a plurality of data portions, each portion of the first data being associated with a respective reticle, and each portion of the second data corresponding to at least one predetermined data constant associated with the plurality of reticles, further including:

a central system database configured and arranged to store portions of the second data corresponding to system requirements of the plurality of reticles, wherein the reticle management controller is communicably coupled to the central system database, the reticle management controller being configured and arranged to store and to retrieve the system data from the central system database, and wherein the portions of the second data corresponding to the system requirements of the plurality of reticles includes:

an attribute identifying the maximum time between inspections of a kitted reticle; and an attribute identifying the maximum time between cleanings of a kitted reticle.

* * * * *

UNITED STATES PATENT AND TRADEMARK OFFICE
CERTIFICATE OF CORRECTION

PATENT NO. : 7,058,627 B2
APPLICATION NO. : 09/842370
DATED : June 6, 2006
INVENTOR(S) : Oren Wiesler et al.

It is certified that error appears in the above-identified patent and that said Letters Patent is hereby corrected as shown below:

Column 14, claim 12, line 4, "apportion" should read --a portion--.

Signed and Sealed this

Twenty-fifth Day of December, 2007

JON W. DUDAS
*Director of the United States Patent and Trademark Office*

UNITED STATES PATENT AND TRADEMARK OFFICE
CERTIFICATE OF CORRECTION

PATENT NO. : 7,058,627 B2  Page 1 of 1
APPLICATION NO. : 09/842370
DATED : June 6, 2006
INVENTOR(S) : Oren Wiesler et al.

It is certified that error appears in the above-identified patent and that said Letters Patent is hereby corrected as shown below:

Column 14, claim 12, line 4, "apportion" should read --a portion--.

Signed and Sealed this

Eighth Day of January, 2008

JON W. DUDAS
*Director of the United States Patent and Trademark Office*